United States Patent [19]

Lee et al.

[11] Patent Number: 5,338,687
[45] Date of Patent: Aug. 16, 1994

[54] DETECTION OF BIOLOGICAL MACROMOLECULES BY NMR-SENSITIVE LABELS

[76] Inventors: Lawrence L. Lee, 3776 Martha St., San Diego, Calif. 92117; James Gautsch, 451 S. Granados Ave., Solana Beach, Calif. 92075

[21] Appl. No.: 943,552

[22] Filed: Sep. 11, 1992

[51] Int. Cl.$^5$ .................. G01N 24/08; G01N 33/561; G01N 33/58
[52] U.S. Cl. .................. 436/173; 204/299 R; 324/300; 324/307; 436/56; 436/94
[58] Field of Search .................. 324/300, 307; 204/299 R, 82.8, 180.13; 436/173, 94, 56

[56] References Cited

U.S. PATENT DOCUMENTS

| | | | |
|---|---|---|---|
| 3,502,973 | 3/1970 | Coulter et al. | 324/71.1 |
| 3,567,611 | 3/1971 | Michel et al. | 204/180.1 |
| 4,580,096 | 4/1986 | Liedholz | 324/204 |
| 4,638,251 | 1/1987 | King | 324/300 X |
| 4,885,696 | 12/1989 | Hara | 436/96 X |

FOREIGN PATENT DOCUMENTS 60-161559 8/1985 Japan ........................ 436/94

OTHER PUBLICATIONS

R. M. Silverstein "Spectrometric Identification of Organic Compounds" 1981, John Wiley & Sons, Inc.: New York, pp. 181–184.
L Stryer "Biochemistry" 1981, W. H. Freeman and Company: San Francisco, Calif, pp. 559–561.
T. P. O'Connor et al. *Biochem.* 1982, 21, 848–854.
D. M. Chen et al. *Chem. Abstr.* 1982, 99, abstract 99:1944s.
R. K. Harris "Nuclear Magnetic Resonance Spectroscopy" 1983, Pitman Book Limited London, pp. 30–35 and 230–231.

Primary Examiner—James C. Housel
Assistant Examiner—Arlen Soderquist

[57] ABSTRACT

An apparatus and method for identifying the presence of biological molecules labeled with isotopes that are identifiable and distinguishable by their responses to nuclear magnetic resonance. The method features the use of labels that are:

1) not radioactive or only weakly radioactive, therefore not hazardous to handle, and have a long storage life.
2) small in molecular weight, thus not significantly changing the electrophoresis migration rate of the labeled material.
3) available as several distinguishable labels, thereby enabling simultaneous detection of several classes of molecules.

10 Claims, 3 Drawing Sheets

DETECTION OF BIOLOGICAL MACROMOLECULES BY NMR-SENSITIVE LABELS

BACKGROUND OF THE INVENTION

The ability to detect the presence of a particular biological molecule or part of such a molecule at a specific location is an indispensable tool in Biological researches and in medicine. Presently, the most frequently used method of detection is to label the molecule with a radioactive isotope and detect the presence of the label by the radiation (usually beta emission) of the label isotope.

Isotopes that are reliable as labels materials emit high-energy electrons at rapid rate. That makes them unsuitable for use in many potential applications. This is especially true in situations where the label isotopes must be applied to living tissues. Furthermore highly radioactive materials are hazardous to handle and have short storage life.

It is therefore highly desirable to have labeling materials that are only slightly radioactive, thus having long storage life; or better yet, not radioactive at all.

There have been serious attempts to define non-radioactive labels. However none of them have yet proven as reliable or as sensitive as radioactive Phosphorus-32.

In some applications, it would be extremely useful to have distinguishable labels on different parts of biological systems, and be able to tell which part is present. An example of such an application is sequencing of DNA.

One of the essential steps in the sequencing of DNA is the use of an elctrophoresis gel column. In this step, the DNA fragments are placed in a reservoir at one end of a polyacrylamide column. An electric field (typically 1KV over a distance of 50 mm) causes the DNA fragments to migrate through electrophoresis towards the anode (at the other end of the column). As the molecules of the DNA fragments travel down the column, some molecules travel faster than others, molecules of different speeds concentrate in discrete bands. After a time period (typically 2 hours), the DNA fragments are spread over a column of discrete bands. Within each band are DNA fragments of a particular migration speed. If the DNA fragments had been labeled with some means of identification (for example radioactive isotopes or fluorescent dyes) then their presences can be detected.

One of the most common and most reliable isotope for labeling is Phosphorus-32 which emits beta radiation (electrons). DNA fragments that are labeled with P-32 are easily detected (for example by x-ray film).

In the case of DNA sequencing, there are four different Dideoxy chain-terminations at the ends of the fragments that need to be identified. P-32 alone can only label one of them. It is still common practice to run four parallel electrophoresis columns with P-32 labeling a different terminations in each column.

It would be extremely useful to be able to have distinguishable labels on different Dideoxy chain-terminations so a single lane gel can be used and the identities of the nucleotides can be determined in real time as the bands pass by a detector that has the capability of distinguishing the identity of the different labels.

There are other beta emitting isotopes besides P-32, but their radiations are spread over a wide spectrum, so one Beta emitter is difficult to distinguish from another. Other distinguishable labels have been used in attempts on automatic DNA sequencing. One such example is the use of several fluorescent dyes that re-emit lights of distinguishable colors. But the dyes are large molecules, attaching such a label to a DNA fragment changes the migration rates, and that causes problems in identification.

The present invention provides a new possibility for labeling molecules in biological studies. The method exploits the response of atomic nuclei to Nuclear Magnetic Resonance (NMR). One of the advantages of the present invention is the possibility of using several distinguishable labels in a system.

The use of nuclear magnetic resonance (NMR) in biology and medicine has become commonplace since the advent of Magnetic Resonance Imaging (MRI) machines. These machines use NMR to detect presence of hydrogen nuclei (protons) in water and fatty tissues. Since MRI is less invasive than X-ray and can detect features that are not observable by X-ray, it has become an indispensable tool in many disciplines of medicine. MRI machines are very expensive. Part of the expense is the cost of the magnets needed to provide the needed field over a large volume (most MRI machines are big enough for people to enter into the magnet area), another part of the expense is the sophisticated electronics, including computers, to map out the protons.

For many biological applications, including automatic sequencing of DNA, neither a large detection area nor a high-resolution image is needed. For such applications, inexpensive permanent magnets can be used instead of large super-conducting magnets, and detection instruments compact enough to fit into small laboratories can become a reality.

Another common application of NMR is in spectroscopy. There the spatial resolution is not critical, but the NMR output is scanned over a wide spectrum at very high spectral resolution.

For many biological applications where isotopes with the suitable NMR properties are used as labels, successful detection of the label isotope requires neither the spatial resolution of MRI nor the spectral resolution of spectroscopy. It can therefore be a much simpler machine.

Technologies developed for MRI and for spectroscopy can obviously be "borrowed", when applicable, to improve the detection of NMR-active labels in biological molecules.

Whereas MRI uses almost exclusively hydrogen as the NMR-active isotope, and spectroscopy uses mostly hydrogen and carbon-13; there are many other isotopes that are suitable for used as NMR-active labels in biological applications.

For applications to automated DNA sequencig, it would be highly desirable to be able to simultaneous identify all four bases at the end of a DNA chain—Adenine, Guanine, Thymine, and Cytosine (A,G,T & C). The present invention provides a possibility for using the following combination of labels:

A labeled with P-31 only,
G labeled with P-31 + H-3,
T labeled with P-31 + F-19
and C labeled with P-31 + F-19 + H-3.

Reasons for the above choice are described in greater details below, in the "Detailed Descriptions" section.

SUMMARY OF THE INVENTION

The present invention provides an apparatus and method for identifying the presence of biological molecules labeled with isotopes that are identifiable and distinguishable by their responses to nuclear magnetic resonance. The method features the use of labels that are:

1) not radioactive or only weakly radioactive, therefore not hazardous to handle, and have a long storage life.
2) small in molecular weight, thus not significantly changing the electrophoresis migration rate of the labeled material.
3) available as several distinguishable labels, thereby enabling simultaneous detection of several classes of molecules.

BRIEF DESCRIPTIONS OF THE DRAWINGS

DETAILED DESCRIPTION

Figure 1A:
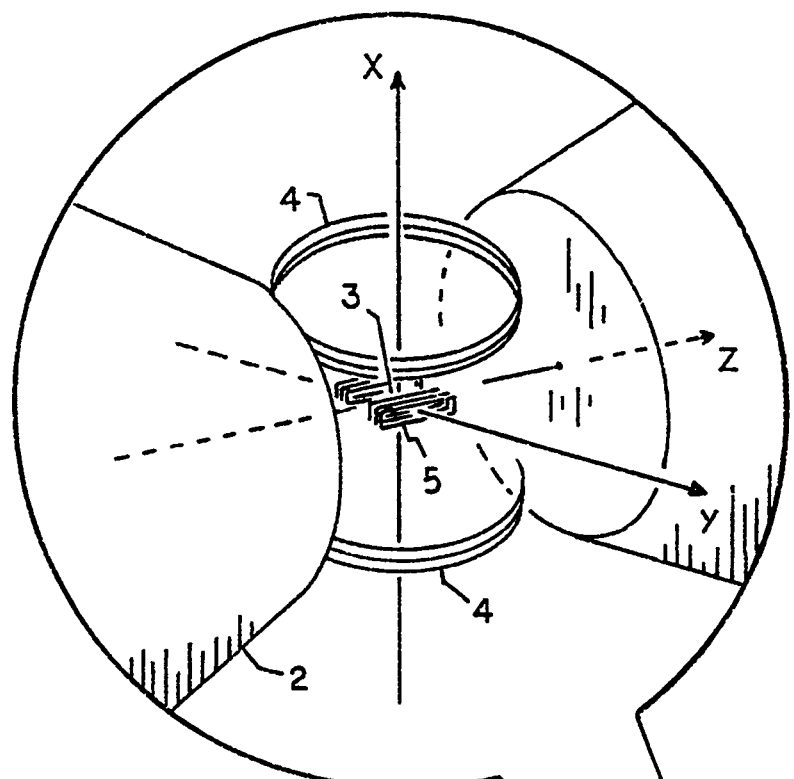
FIG. 1a shows a magnified view of a part of the apparatus of FIG. 1.
Figure 1:
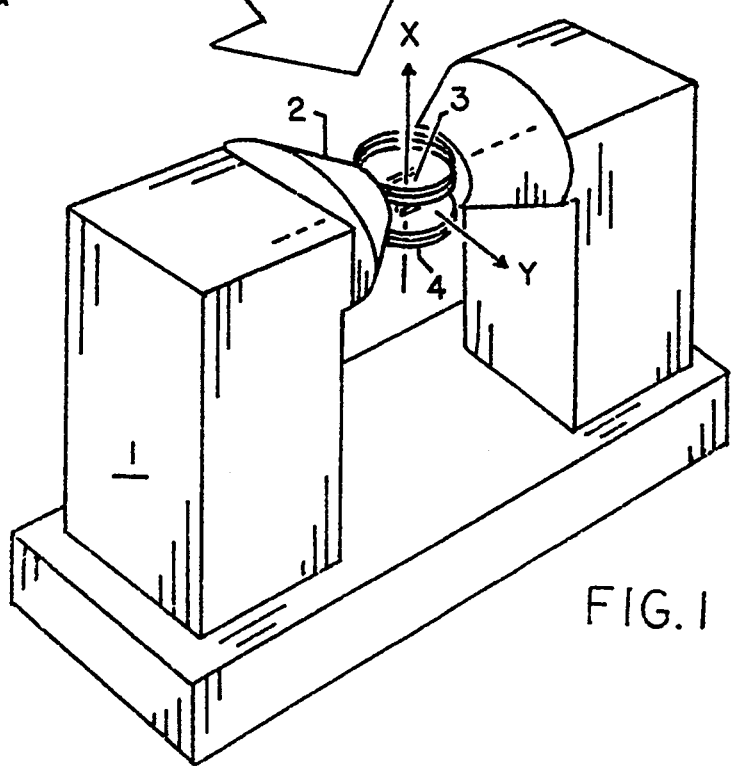
FIG. 1 shows a perspective view of an apparatus for detecting NMR

An apparatus for detecting the presence of NMR-sensitive isotopes is shown in FIGS. 1 and 1a. The apparatus comprises a magnet 1 with pole pieces 2 to generate a stable and homogeneous magnetic field in the sample area 3. It is usually desirable to have the magnetic field as strong as possible. NMR would be very difficult to observe in any field less than one thousand Gauss (1KG). The magnet 1 may be a permanent magnet, an electromagnet, or a superconductor magnet. Permanent magnets are the least expensive, they also require the least maintenance, and provide a very stable field of strength up to around 15K Gauss; electromagnets can provide more field strength, but they consume power and usually require cooling in addition to feedback circuits to keep the field stable; Superconductor magnets provides the highest field strength (100K Gauss), but they are presently most expensive and must be kept at liquid Helium temperatures.

Positioned around the sample area 3 is a set of coils 4 for applying a radio frequency (RF) input magnetic field to the sample in a direction perpendicular to the constant magnetic field. The magnetic field oscillating at the NMR frequency excites the nuclei to a higher energy state, the energy is later reemitted as an output signal.

Another set of coils 5 (oriented perpendicular to both the constant magnetic field and the input RF field) is provided for detecting NMR output from the sample. The output from coils 5 is fed to a RF receiver (not shown in FIGS. 1 & 1a). In the coordinates system shown in FIGS. 1 and 1a, the axis of the input coils 4 is along the x axis, the axis of the output coils 5 along the y axis, and the constant field is along the z axis.

The output coils 5 shown in FIGS. 1 & 1a are thin and rectangular in shape so they will pick up only NMR signals from a small range of positions along the x-axis. The output coils 5 are oriented substantially perpendicular to the input coils 4. The positions and orientations of the input and output coils are carefully adjusted so that the output coils 5 pick up as little of the RF signal directly from the input coils 4 as possible.

Figure 3:
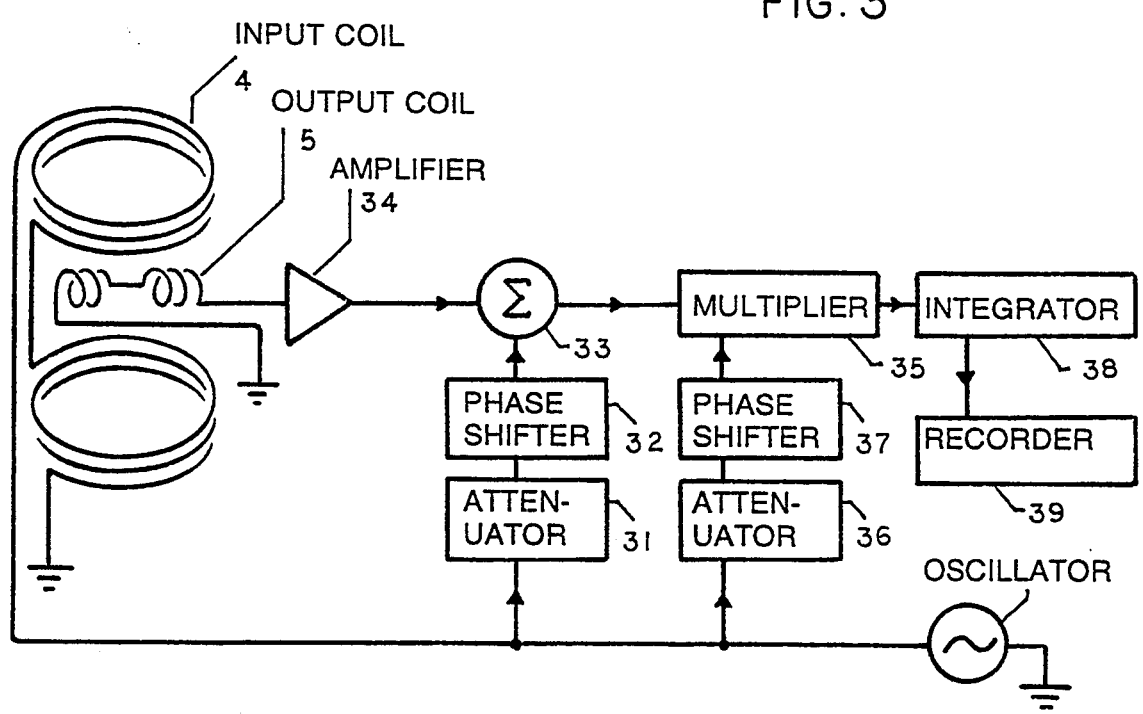
FIG. 3 shows some electronic components for detecting NMR.

It may be difficult, by mechanical adjustments alone, to reduce the direct-coupled noise (unwanted signal coupled directly from the input coils 4 to the output coils 5) to a low enough level for satisfactory detection of the NMR output. When necessary, the residual direct-coupling noise, may be further reduced electronically, by adding to the output a part of the input signal with the amplitude and phase adjusted (when no NMR nuclei is present in the sample area) to null out all the direct-coupling noise. This electronic nulling circuit is shown as an attenuator 31, a phase-shifter 32 and adding circuits 33 in FIG. 3.

Figure 2:
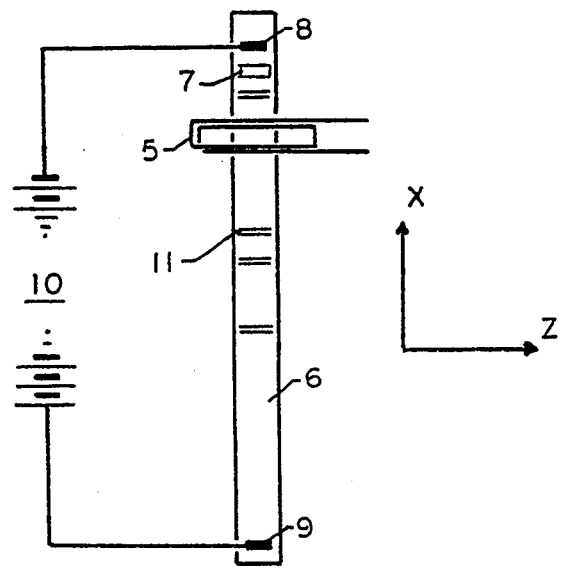
FIG. 2 shows the output coil from the apparatus of FIG. 1 positioned along an electrophoresis gel column.

FIG. 2 shows the output coil 5 positioned along an electrophoresis column 6. The electrophoresis column 6 is similar to the type used for sequencing DNA. At the top of the column 6 is a cathode 8 and a reservoir 7 where the DNA samples are initially positioned. At the bottom of the column 6 is an anode 9. An electric voltage source 10 maintains an electric field between the anode and the cathode. Typically, the column 6 would be a polyacrylamide gel column, about 50 mm long. A typical voltage across the electrodes 8 and 9 is around 1 kv. Bands of DNA fragments 11 are detected as they migrate pass the output coil 5.

The NMR output signal from the output coils is amplified by an amplifier 34 (FIG. 3); and the direct-coupling noise is removed by electronic nulling. The signal is then multiplied (with multiplier 35) to a component of the input RF signal (this component of the input signal is adjusted, by means of an attenuator 36 and a phase-shifter 37, to be in-phase with the output signal). The product is then integrated, by integrator 38, over a period of time (typically, 1 second). Upon integration, the random noise averages out to zero; but the in-phase product of the NMR input and output signals integrates out to a detectable value, and may be displayed by a recorder 39.

The technique for enhancing signal-to-noise ratio by multiplying the input and output signals and integration over time is well known among electronic engineers as "coherent detection". It is one of the simplest methods to extract usable data from the very weak NMR output signals. Continuous wave (CW) RF signals as weak as $10^{-9}$ volt can be successfully detected by this technique. More sophisticated methods for processing NMR signals have been developed: For example, Pulsed Fourier Transform techniques for NMR spectroscopy and Computer Image Reconstruction techniques for MRI provide higher performances than the relatively simple method described here. These more advanced techniques can obviously be "borrowed" when their higher performances are required and their much higher costs can be tolerated.

It is desirable to use as label nuclei isotopes that have the highest sensitivity to NMR (thus providing the strongest output signals). Among the isotopes that are most sensitive to NMR are Hydrogen-1, Hydrogen-3, and Fluorine-19.

Hydrogen-1, among all stable isotopes, has the highest NMR sensitivity. That is fortunate for MRI applications. However, for some other biological studies (such as sequencing of DNA), hydrogen-1 is probably not a particularly good label material because the molecules to be studied are usually surrounded by a large quantity of water, so any label of hydrogen-1 would be confused with the large background of hydrogen-1 in water.

Fluorine-19 is the second most sensitive stable isotope for NMR, it is the most abundant isotope in natural Fluorine, and it is not radioactive. Fluorine is not present in any appreciate amount in most biological systems, but it can easily replace hydrogen in many organic molecules so it is an excellent candidate for use as an artificially-introduced label material.

Hydrogen-3 (Tritium) has the highest sensitivity for NMR, it is weakly radioactivity, emitting low-energy beta particles and having a half-life of over twelve years (by comparison, Phosphorus 32, a frequently-used radioactive label, emits 100-times-more-energetic beta particles, and has a halflife of about two-weeks). Hydrogen-3 is chemically identical to ordinary hydrogen, that can be a very important advantage when the labeled molecules has to go through some chemical reactions before detection.

Artificial introduction of a NMR sensitive labeling isotope to a biological molecules is quite similar to the introduction of radioactive labels. Techniques for such processed are well-developed, and label materials such as Fluorouracil and Tritium-labeled deoxynucleotide Triphosphates ($H^3$ dNTP's) are easily available.

One advantage of the use of NMR for labeling molecules in Biological systems is the possibility for using more than one distinguishable label isotopes in a system. Different label isotopes can be easily distinguished by their NMR frequencies (in general, NMR has very narrow bandwidth and different isotopes in the same magnetic field have widely different NMR frequencies.) The NMR frequency of a nucleus in a given magnetic field is also affected by the surrounding molecular structure: but this effect (usually less than 0.2%) is very small compared to the differences of frequencies between different isotopes. In most cases, the NMR frequency of the isotope in the labeled molecule (or a similar molecule) can be determined and compensated for before the experiment. The frequencies and sensitivities of most common isotopes are available from handbooks (such as the Handbook of Chemistry and Physics).

For applications to automated DNA sequencing, it would be highly desirable to be able to simultaneous identify all four possible bases at the end of a DNA chain—Adenine, Guanine, Thymine, and Cytosine (A,G,T & C). In order to provide four distinguishable labels, one needs one more label isotope (in addition to Hydrogen-3 and Fluorine-19).

Phosphorus-31 is the "natural phosphorus", it is not radioactive, and its sensitivity to NMR (at constant magnetic field) is about one-sixteenth that of Hydrogen-1. In spite of its much lower sensitivity, Phosphorus-31 is potentially an excellent label material for DNA because Phosphorus is present naturally in the DNA chains.

With the above listed bases and suggested label isotopes, one possible combination for labeling is:

A labeled with P-31 only,
G labeled with P-31 + H-3,
T labeled with P-31 + F-19
and C labeled with P-31 + F-19 + H-3.

Of course other combinations, or combinations using other isotopes can also be used for labeling.

There are other isotopes (besides H-1, H-3, and F-19) that have higher NMR sensitivity than Phosporus-31. Some of them may also turn out to be good materials for NMR labeling. However, it is not clear whether the advantage of being more sensitive to NMR alone would make them better choice than Phosphorus which is already in DNA. Some of these isotopes are difficult to attach by chemical means (for example Helium-3). Some may have potentially-unacceptable effects on the biological properties of the labeled molecules (most metals—Lithium-7, Sodium-23, Aluminum-27, and several heavier metals are all questionable as labels for biological systems). Boron is commonly used in the buffer in electrophoresis gel columns, so the use of Boron-11 as label may be troubled by the presence of the same nuclei in the background. Carbon-13, less sensitive to NMR than P-31, is also questionable as label because of the large quantity of carbon atoms in all biological systems.

Figure 4:
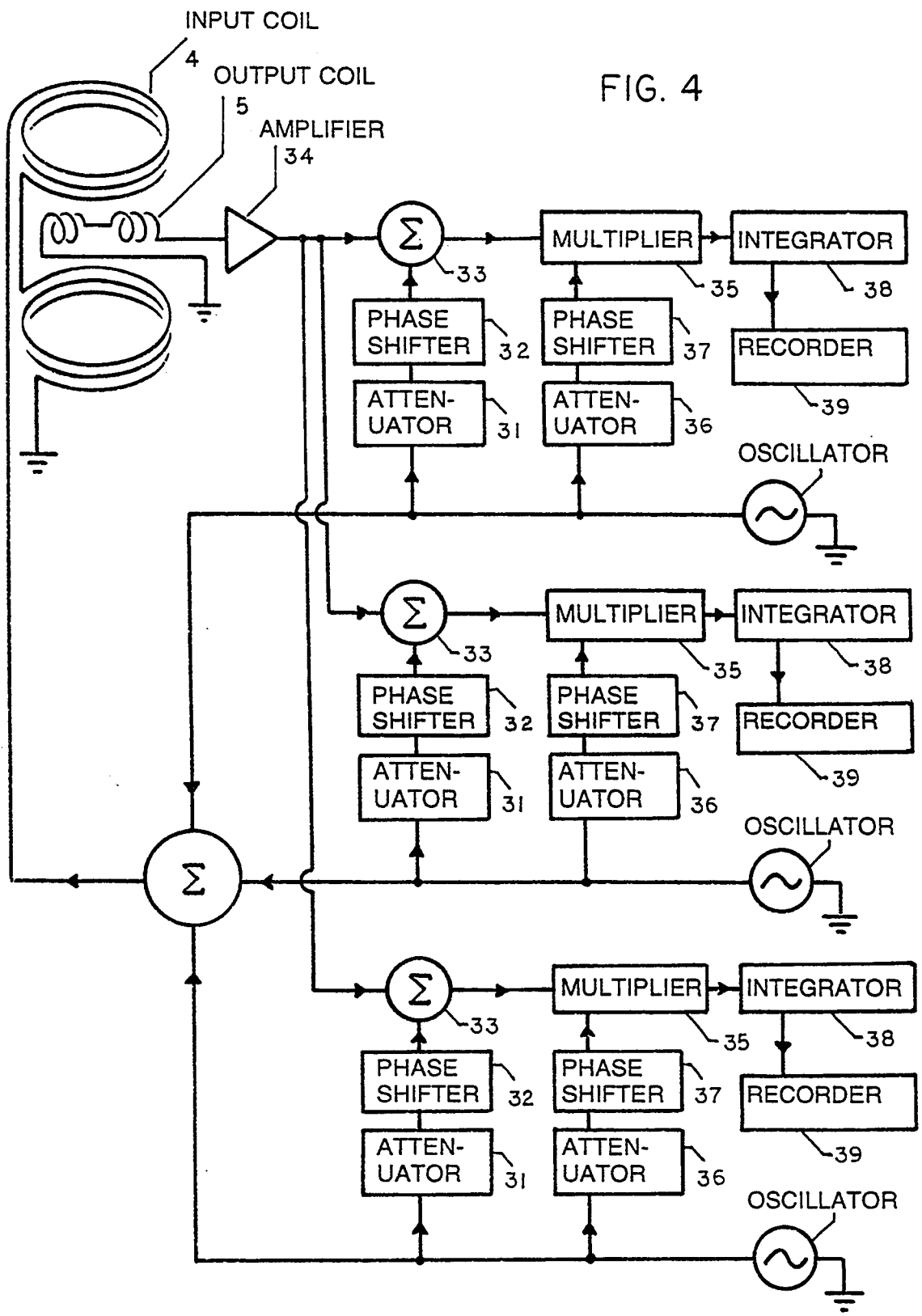
FIG. 4 shows some electronic components for simultaneous detection of NMR at more than one RF frequencies.

When more than one labeling isotopes are used with the apparatus of FIGS. 1 and 1a, the input RF field at the input coil 4 may be the sum of the signals at all the NMR frequencies of the labeling isotopes used. The different label isotopes can be distinguished by feeding the NMR output into several coherent detectors as shown in FIG. 4, each detector will detect NMR output at only one of the input frequencies.

The present invention can be used in other Biological applications (besides sequencing of DNA), for example, determining the sequences in RNA. In these other applications, the details of the apparatus and procedures may differ from those mentioned above; but the basic idea of using NMR-sensitive labels remains the same.

The apparatus described so far detects the output signals from the test samples' NMR response to a continuous wave (CW) input. NMR is also observable in other forms, for example:

1) NMR absorption; the absorption of RF signal from the input coils can also be observed and be used to detect the presence of the NMR label nuclei.

2) Pulsed input, Pulse Fourier-transform techniques are often used in spectroscopy.

3) Multiple output observations; the output is observed at many positions, and an image of the NMR source is reconstructed from the relative amplitudes and phases of the output at the different observation points. This method is used in MRI machines.

Any of these or other variations or combinations of them may be used instead of the apparatus and method described above, and the application will still fall within the scope of the present invention.

The present invention provides a method for identifying the presence of biological molecules which have been labeled with isotopes that can be detected by their responses to nuclear magnetic resonance. The method features the use of labels that are:

1) not radioactive or only weakly radioactive, therefore not hazardous to handle, and have a long storage life.

2) small in molecular weight, thus not significantly changing the electrophoresis migration rate of the labeled material.

3) available as several distinguishable labels, thereby enabling simultaneous detection of several classes of molecules.

I claim:

1. An apparatus for detecting electrophoretically separated biological molecules having at least one nuclear magnetic resonance-sensitive isotope comprising:
   a) a magnet for providing a magnetic field of at least 1000 gauss at a predetermined sample area;
   b) excitation means for exciting at least three nuclear magnetic resonance-sensitive isotopes of said separated biological molecules at said predetermined sample area;
   c) detection means for detecting and identifying which of said at least three nuclear magnetic resonance-sensitive isotopes are present in the separated biological molecules at said predetermined sample area; and
   d) an electrophoresis column positioned to deliver the separated biological molecules to the sample area where at least one nuclear magnetic-sensitive isotope is subjected to the magnetic field of the magnet, excited by the excitation means, and detected and identified by the detection means.

2. An apparatus according to claim 1 wherein said excitation means comprises radio frequency source means for exciting said at least three nuclear magnetic resonance-sensitive isotopes.

3. An apparatus according to claim 2 wherein said at least three nuclear magnetic resonance-sensitive isotopes comprise hydrogen-3, fluorine-19, and phosphorus-31.

4. An apparatus according to claim 1 wherein said detection means comprises radio frequency receiver means tuned to frequencies for detecting said at least three nuclear magnetic resonance-sensitive isotopes.

5. An apparatus according to claim 4 wherein said at least three nuclear magnetic resonance-sensitive isotopes comprise hydrogen-3, fluorine-19, and phosphorus-31.

6. A method for use with electrophoresis to analyze a mixture of biological molecules comprising the steps of:
   a) labeling said mixture of biological molecules with nuclear magnetic resonance-sensitive isotopes such that the biological molecules have at least one of at least three nuclear magnetic resonance-sensitive isotopes;
   b) separating said mixture of biological molecules on an electrophoresis column to form bands of separated biological molecules;
   c) exposing said separated biological molecules to a magnetic field of at least 1000 gauss;
   d) providing means for exciting each of said at least three nuclear magnetic resonance-sensitive isotopes while said separated biological molecules are in said magnetic field; and
   e) detecting and identifying which of said at least three nuclear magnetic resonance-sensitive isotopes are present in the separated biological molecules in said magnetic field.

7. The method according to claim 6 wherein said at least three nuclear magnetic resonance-sensitive isotopes comprise hydrogen-3, fluorine-19, and phosphorus-31.

8. The method according to claim 6 wherein said biological molecules are chosen from the group consisting of ribonucleic acid and deoxyribonucleic acid.

9. The method according to claim 6 wherein said biological molecules are nucleic acid fragments having at least one phosphorus-31 atom as a nuclear magnetic resonance-sensitive isotope, each of said nucleic acid fragments having one of four different nucleotide bases at the termination of said fragments; and wherein the step of labeling comprises attaching up to two additional nuclear magnetic resonance-sensitive isotopes, selected from the group consisting of hydrogen-3 and fluorine-19, to said four different nucleotide bases at the termination of said fragments to distinguish between the four different nucleotide bases at the termination of said fragments.

10. The method according to claim 6 wherein said biological molecules are nucleic acid fragments, each of said nucleic acid fragments having one of four different nucleotide bases at the termination of said fragments; and wherein after the step of labeling the four different nucleotide bases at the termination of said fragments are distinguished by phosphorus-31 being the nuclear magnetic resonance-sensitive isotope of a first of said four different nucleotide bases, hydrogen-3 and phosphorus-31 being the nuclear magnetic resonance-sensitive isotopes of a second of said four different nucleotide bases, fluorine-19 and phosphorus-31 being the nuclear magnetic resonance-sensitive isotopes of a third of said four different nucleotide bases, and hydrogen-3, fluorine-19 and phosphorus-31 being the nuclear magnetic resonance-sensitive isotopes of a forth of said four different nucleotide bases.

* * * * *